(12) United States Patent
Nikitin et al.

(10) Patent No.: US 10,440,539 B2
(45) Date of Patent: Oct. 8, 2019

(54) SYSTEMS AND METHODS FOR ANTENNA PATTERN MEASUREMENT

(71) Applicant: INTERMEC, INC., Lynnwood, WA (US)

(72) Inventors: Pavel Nikitin, Seattle, WA (US); Jason Harrigan, Sultan, WA (US)

(73) Assignee: INTERMEC, INC., Lynnwood, WA (US)

( * ) Notice: Subject to any disclaimer, the term of this patent is extended or adjusted under 35 U.S.C. 154(b) by 324 days.

(21) Appl. No.: 15/292,587

(22) Filed: Oct. 13, 2016

(65) Prior Publication Data

US 2018/0109331 A1  Apr. 19, 2018

(51) Int. Cl.
| | |
|---|---|
| H04W 4/70 | (2018.01) |
| H04B 5/00 | (2006.01) |
| G01R 29/10 | (2006.01) |
| H01Q 1/22 | (2006.01) |

(52) U.S. Cl.
CPC .............. *H04W 4/70* (2018.02); *G01R 29/10* (2013.01); *H04B 5/0062* (2013.01); *H01Q 1/2208* (2013.01)

(58) Field of Classification Search
CPC ...... G01R 29/00; G01R 29/10; H01Q 1/2208; H01Q 1/40; H04B 5/0062; H04W 4/70
See application file for complete search history.

(56) References Cited

U.S. PATENT DOCUMENTS

| | | | |
|---|---|---|---|
| 5,430,369 A | 7/1995 | Bolomey et al. | |
| 6,031,498 A | 2/2000 | Issler | |
| 7,443,170 B2 | 10/2008 | Garreau et al. | |
| 7,672,640 B2 | 3/2010 | Nyshadham et al. | |
| 9,267,967 B2 | 2/2016 | Garreau et al. | |
| 2007/0244657 A1* | 10/2007 | Drago | H04B 5/02 702/81 |
| 2008/0084295 A1* | 4/2008 | Libby | G08B 13/2494 340/539.22 |
| 2009/0231142 A1* | 9/2009 | Nikitin | G06K 7/0008 340/572.8 |
| 2010/0039228 A1* | 2/2010 | Sadr | G01S 5/12 340/10.1 |
| 2012/0147153 A1* | 6/2012 | Lin | G01R 29/0892 348/51 |

(Continued)

OTHER PUBLICATIONS

Kummer et al; "Antenna Measurements—1978;" Proceedings of the IEEE; Apr. 4, 1978; vol. 66; No. 4; pp. 483-507.

(Continued)

*Primary Examiner* — Yuwen Pan
*Assistant Examiner* — Fatuma G Sherif
(74) *Attorney, Agent, or Firm* — Oliff PLC; R. Brian Drozd (57) ABSTRACT

Systems and methods for antenna pattern measurement are provided. One system includes a plurality of wireless sensors arranged in an array, wherein the wireless sensors are configured to be powered by radio-frequency (RF) signals at different power levels. The system also may include a controller configured to wirelessly transmit the RF signals at different power levels and measure responses from the wireless sensors at the different power levels. The system may further include a processor configured to calculate a radiation pattern of an antenna under test using the measured responses.

20 Claims, 5 Drawing Sheets

(56) References Cited

U.S. PATENT DOCUMENTS

2013/0154801 A1* 6/2013 O'Haire ............ G06K 7/10009
340/10.1

OTHER PUBLICATIONS

Cutler et al; "Microwave Antenna Measurements;" Proceedings of the I.R.E.; vol. 35, No. 12; Dec. 1947; pp. 1462-1471.
"Antenna Measurement and Radome Test Systems;" Catalog; Microwave Vision Group; 144 pp.; retrieved from http://www.mvg-world.com/en/system/files/AMS_catalog_bd-update_030414.pdf on Oct. 13, 2016.
"Experts in electromagnetic compatibility and interference testing;" EMxpert; retreived from http://www.emscan.com/emxpert/EMx_action.cfm on Oct. 13, 2016.

* cited by examiner

SYSTEMS AND METHODS FOR ANTENNA PATTERN MEASUREMENT

BACKGROUND

Antenna pattern measurement devices and methods are used to determine antenna patterns for radiating systems. For example, these devices and methods are used to determine antenna patterns when designing devices for radiated systems, such as radio-frequency (RF), cellular and Radiofrequency Identification (RFID) systems, among others. The determined antenna patterns may be used to ensure that the radiated antenna signals comply with regulations with respect to radiated power of the systems. Additionally, the antenna pattern defines the performance characteristics of the system.

Some antenna pattern measurement devices include two-axis positioners and scanning rotating arcs with multiple probes. Other devices measure near field distribution using an array of calibrated loops embedded into a printed circuit board (PCB). The setup of these devices require multiple probes and receivers, either with multiple receivers connected to probe antennas via wires, cables, and peripheral electronics, or probe antennas being sequentially switched and individually measured by a receiver such as a spectrum analyzer.

Thus, conventional antenna pattern measurement devices and methods require expensive bulky equipment, such as rotating stands with two-axis positioners, rotating arcs and/or multiple wired probes and sensors.

SUMMARY

To overcome these and other challenges, aspects of broad inventive principles are disclosed herein.

In one embodiment, a system may include a wireless transmitter configured to transmit radio-frequency (RF) signals to an array of radio-frequency identification (RFID) tags that includes (1) a first RFID tag that is configured to only be activated when receiving a first RF signal at a power level above a first threshold and (2) a second RFID tag that is configured to be only activated when receiving a second RF signal at a power level above a second threshold different from the first threshold, each RFID tag of the array of RFID tags includes in memory an identifier unique to the RFID tag. The system may further include a wireless receiver configured to receive signals from RFID tags activated in response to receiving the first or section RF signals, the signals from the RFID tags including the identifier of the respective RFID tag. The system may yet further include a processor configured to calculate a radiation pattern of the wireless transmitter by calculating for each respective RFID tag a determined power level for each respective activated RFID tag and plotting the determined power level at a location associated with the respective RFID tag.

In one embodiment, an antenna pattern measurement system is provided that includes a wireless transmitter connected to an antenna under test, wherein the wireless transmitter is configured to wirelessly transmit radio-frequency (RF) signals. The antenna pattern measurement system further includes a plurality of radio-frequency identification (RFID) tags arranged in an array such that different subsets of the RFID tags are activated at different power levels. Each of the plurality of RFID tags is configured to be activated by the RF signals from the wireless transmitter and to backscatter signals. The antenna pattern measurement system further includes a wireless receiver configured to receive the backscatter signals from the RFID tags at the different power levels and a memory configured to store radiation pattern reconstruction data including identifying data for received backscatter signals for each of the RFID tags indicating the power level at which each of the RFID tags was activated. The antenna pattern measurement system also includes a processor configured to calculate a radiation pattern for the antenna under test using the radiation pattern reconstruction data.

In another embodiment, a system is provided that includes a plurality of wireless sensors arranged in an array, wherein the wireless sensors are configured to be powered by radio-frequency (RF) signals at different power levels. The system also includes a controller configured to wirelessly transmit the RF signals at different power levels and measure responses from the wireless sensors at the different power levels. The system further includes a processor configured to calculate a radiation pattern of an antenna under test using the measured responses.

In another embodiment, a method for calculating an antenna pattern is provided. The method includes transmitting RF signals wirelessly at different power levels to a plurality of wireless sensors arranged in an array to power the plurality of wireless sensors and cause the wireless sensors to transmit response signals. The method also includes receiving the response signals from the wireless sensors at the different power levels and calculating a radiation pattern of an antenna under test using the received response signals and a geometry of the array.

DETAILED DESCRIPTION

The exemplary embodiments described herein provide detail for illustrative purposes and are subject to many variations in structure and design. It should be appreciated, however, that the embodiments are not limited to a particularly disclosed embodiment shown or described. It is understood that various omissions and substitutions of equivalents are contemplated as circumstances may suggest or render expedient, but these are intended to cover the application or implementation without departing from the spirit or scope of the claims.

Also, it is to be understood that the phraseology and terminology used herein is for the purpose of description and should not be regarded as limiting. The terms "a," "an," and "the" herein do not denote a limitation of quantity, but rather denote the presence of at least one of the referenced object. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various embodiments include an antenna pattern measurement system and/or system using an array of wireless sensors for reconstructing an antenna radiation pattern that operates without mechanical moving parts. Accordingly, various embodiments of the system and/or method are low cost, portable, and light. Additionally, the systems and/or methods can be used as a far field or as near field measurement system and/or method as described herein.

It should be noted that while the various embodiments are described in connection with particular wireless sensors having particular operating characteristics, the various embodiments are not limited to the specific wireless sensor or any particular operating environment. Thus, one or more embodiments may be used in connection with different wireless sensors or other devices in an antenna pattern measurement setting.

Figure 1:
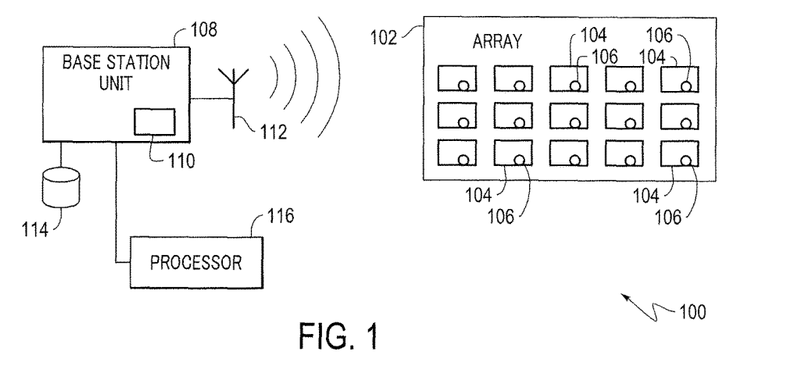
FIG. 1 is a block diagram illustrating an antenna measurement system according to one or more embodiments.

As illustrated in FIG. 1, an antenna measurement system 100 in accordance with various embodiments includes an array 102 of wireless sensors 104. In one embodiment, each wireless sensor 104 is an antenna (such as dipoles or cross-dipole or other structure, such as a wideband antenna) having a smart circuit 106 that harvests RF power, activate or wakes up at certain power level, and can backscatter a code (e.g., unique ID) or signal back to a base station unit 108 (including a signal generator 110) connected to an antenna 112 under test. Antenna radiation pattern reconstruction data is then stored in a memory, such as a database 114, which in various embodiments identifies the wireless sensors 104 responding at different power levels as determined from the backscattered signals as discussed herein. A processor 116 is configured to calculate or reconstruct a radiation pattern using the antenna radiation pattern reconstruction data.

In various embodiments, the antenna measurement system 100 does not have any mechanical moving parts. In operation, because there are no moving parts or switching involved, the measurement process is very fast and improved over conventional measurement systems. Thus, the antenna measurement system 100 can be used to quickly and accurately measure different wireless characteristic, such as total radiated power (TRP).

It should be noted that in some far field measurement embodiments, a large surface may be covered in the far field with the wireless sensors 104 that are wired via switches to a network or spectrum analyzing equipment.

The antenna measurement system 100 may include as the wireless sensors 104, RFID tags (or RFID like sensors), and the antenna measurement system 100 may be configured with an automatic calibration functionality where the distance to the array 102 of sensors 104 is automatically determined (e.g., by calculating the distance from the measurement of phases of tag signals from the wireless sensors 104, using for example, one of the methods described in U.S. Pat. No. 8,248,210). In some embodiments, the antenna measurement system 100 uses RFID-like sensors as the wireless sensors 104 that are powered and report data on one frequency (e.g., 915 MHz used by an external RFID reader operating as the base station unit 108), with the measurement of incident power to be performed at other frequencies (e.g., 2.4 GHz, etc.). This operation at variable frequencies (which may also be provided at variable power) allows the antenna measurement system 100 to operate at different wireless bands.

Figure 2:
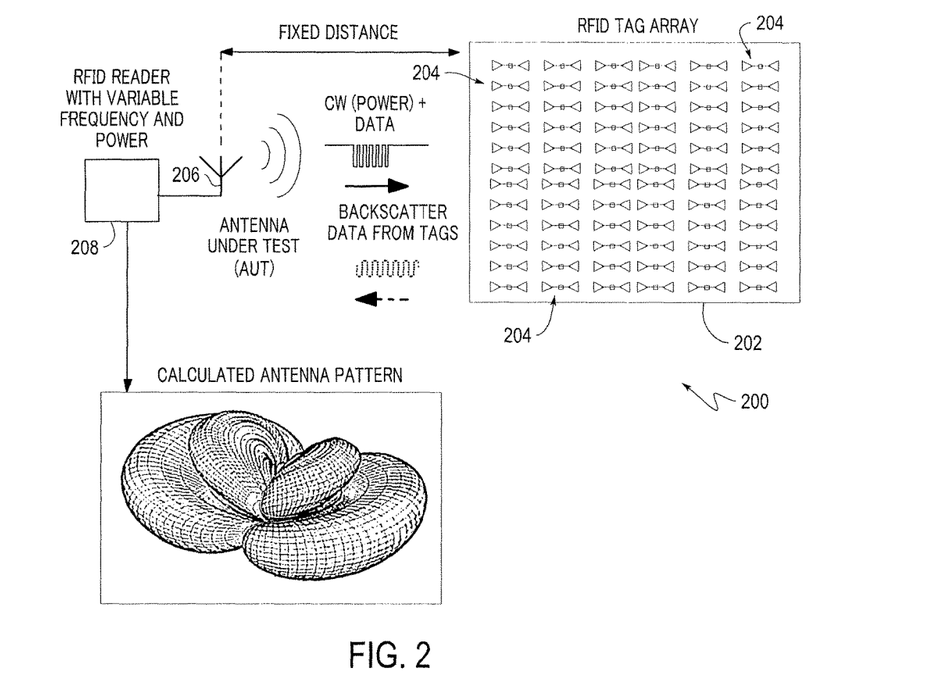
FIG. 2 is a diagram illustrating another antenna measurement system according to one or more embodiments.

For example, as illustrated in FIG. 2, an antenna measurement system 200 is provided that includes an RFID tag array 202. The RFID tag array 202 includes multiple RFID tag ICs 204, which may be embodied as the wireless sensors 104 illustrated in FIG. 1. It should be noted that the number and arrangement of the RFID tag ICs 204 (or wireless sensors 104 shown in FIG. 1) may be varied as desired or needed. In one or more embodiments, the RFID tag ICs 204 are positioned or placed on a flat, spherical or other shaped surface (e.g., a flexible or semi-flexible base or sheet) at a certain defined distance from the antenna under test (AUT) 206. The AUT 206 is connected to a base station transceiver 208 (illustrated as an RFID reader (or similar device) configured to communicate with the sensors (RFID tag ICs 204), such as by using an RF modulated and/or unmodulated carrier with variable output power and frequency. Because the RFID tag ICs 204 or other sensors are wirelessly powered, the RFID tag ICs 204 do not need to be wired or connected. As such, in various embodiments, the RFID tag ICs 204 can be arranged to minimize mutual effect. It should be appreciated that even in the case of mutual coupling, the antenna measurement system 200 can be calibrated.

In operation, the antenna measurement system 100 and/or the antenna measurement system 200 allows for the fast evaluation of the radiation pattern of the antenna 112 or AUT 206. In some embodiments, the antenna 112 or AUT 206 is connected to a device that generates the RF signal that activates and powers the wireless sensors 104 or RFID tag ICs 204, and the same device receives or acquires information from the wireless sensors 104 or RFID tag ICs 204. For example, in various embodiments, the base station unit 108 or base station transceiver 208 connected to the antenna 112 or AUT 206 is configured to operate similar to an RFID reader (e.g., capable of sending and receiving RFID signals).

In other embodiments, the antenna 112 or AUT 206 is configured to transmit normally using the wireless protocol typically used by the antenna 112 or AUT 206, and a sensor reader or RFID reader at a separate frequency powers the wireless sensors 104 or RFID tag ICs 204, and reads the signal strength of the frequency under test. In this configuration, the wireless sensors 104 or RFID tag ICs 204 have either dual-band antennas or dual antennas, one antenna supporting measurements of the frequency under test and another antenna supporting the RFID tag power and data collection and reporting functionality.

In some embodiments, visual indicators may be provided. For example, light emitting diodes (LEDs) can also be added to the sensors (e.g., RFID tag ICs 204) to provide an instantaneous visualization of the RF field pattern produced by the signals transmitted via the antenna 112 or AUT 206.

Thus, the antenna measurement system 100 and/or the antenna measurement system 200 in various embodiments provides wireless sensors 104 or RFID tag ICs 204 that are powered wirelessly and with data also acquired (or received) wirelessly. For example, as described herein, the functionality can be performed by one device (e.g. RFID reader-like device) connected to the antenna 112 or AUT 206. Thus, the array 102 or 202 does not need to be wired to the rest of the system.

In operation, various embodiments use RFID technology, including RFID tags that are configured to behave as individually addressable power sensors that turn on at a strictly predefined power levels (equal to tag sensitivity), with 0.1 dB accuracy in some embodiments. By sweeping the power and frequency of the reader (e.g., RFID reader 208) and recording which sensor tags 104, 204 or 216 respond at which power level, the radiation pattern of the antenna under test is reconstructed using antenna reconstruction methods. Because RFID tags have a very sharp power on point, the received RFID data can be obtained accurately and the arrangements disclosed herein result in a low cost (passively powered) system to measure an antenna pattern. Thus, various embodiments are able to determine which sensor tags 104, 204 or 216 turn on based on a unique identification (ID) for each of the tags, and with known information regarding the position of the sensor tags 104, 204 or 216 in the array, the information can be used to reconstruct the radiation pattern. It should be noted that in some embodiments, the sensor tags 104, 204 or 216 may be off-the-shelf RFID tags.

Various embodiments use the received RFID tag data to reconstruct a radiation pattern based on a measured field at a particular plane. The measurement of the field is performed using devices (sensor tags 104, 204 or 216) that require no power supplied thereto by wires. As the power transmitted to the sensor tags 104, 204 or 216 is increased, more of the sensor tags 104, 204 or 216 will be activated (e.g., at the periphery of the array or measurement area), such that based on which sensor tags 104, 204 or 216 are turned on at the different power levels, and knowing the location of the tags, a radiation pattern can be reconstructed. As should be appreciated, by practicing one or more embodiments, various different operating band antennas (e.g., 900 MHz, 2.4 GHz, 5.8 GHz) can be tested, but the array 102 or 202 may be designed specifically for testing in that specific band, for example, by using sensor tags 104, 204 or 216 operable at the particular frequency band of interest.

In one embodiment, the antenna pattern is calculated as a function of the array geometry and swept power levels (e.g., CW power) for various geometries, such as sensor tags 104, 204 or 216 arranged on hemisphere surrounding the antenna under test 112 or 206, sensor tags 104, 204 or 216 arranged on plane near the antenna under test 112 or 206, etc. Thus, the sensor tags 104, 204 or 216 may be arranged (e.g., spaced and oriented) in many different patterns and arrangements based on the desired or required testing for the antenna under test 112 or 206.

Figure 3:
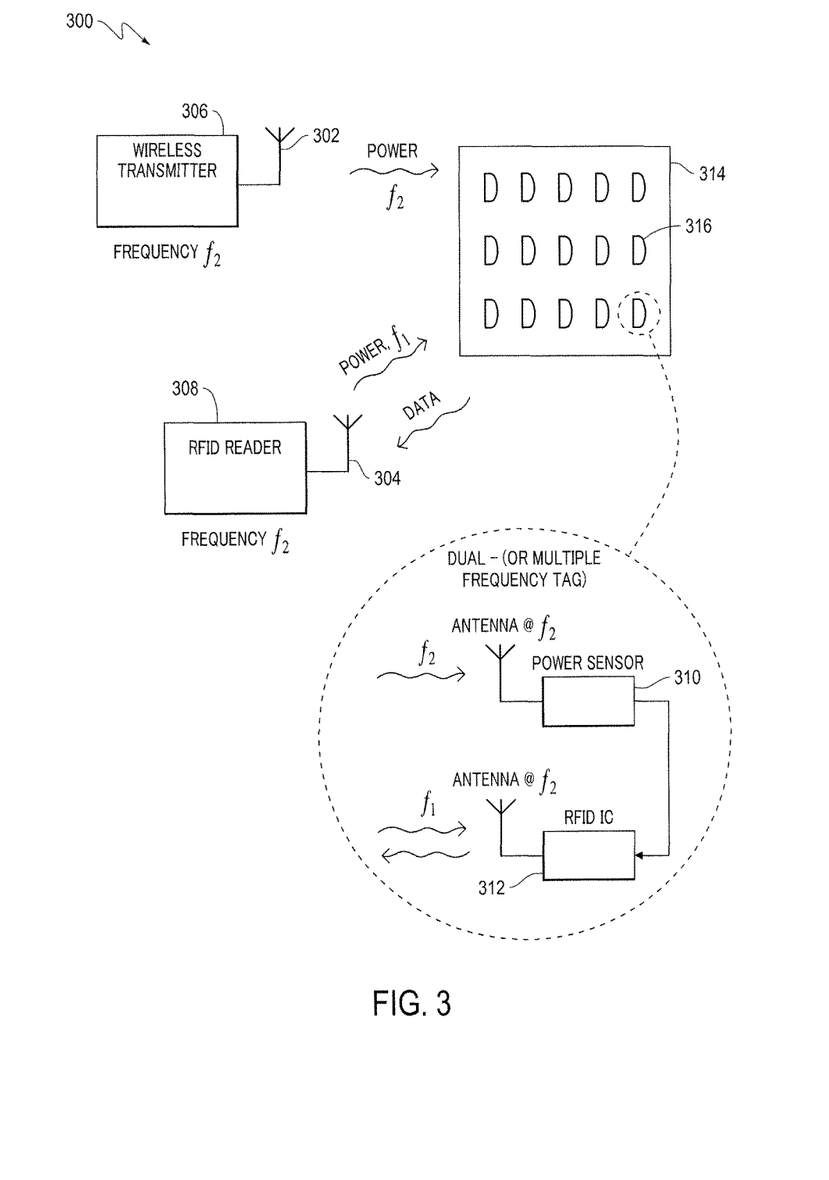
FIG. 3 is a diagram illustrating another antenna measurement system according to one or more embodiments.

In some embodiments, such as the antenna measurement system 300 shown in FIG. 3, two antennas 302, 304 (coupled to a corresponding transmitter 306 and data acquisition device 308, illustrated as an RFID reader) can be implemented as mutually orthogonal dipoles such that the antennas 302, 304 are decoupled from each other. It should be noted that the antenna 302 is the antenna under test (also referred to as the device under test antenna). In this configuration, a power sensor 310 (of the RFID tags 316 that form part of a RFID tag array 314) can be an RF-to-DC rectifier with a voltage measuring circuit on the output, feeding the data into an RFID integrated circuit (IC) 312 (which can be individually identified). For example, RFID read signals transmitted from the data acquisition device 308 at a particular power level causes some of the RFID tags 316 to be activated and respond with a unique RFID response signal, such as based on a unique ID stored in the RFID IC 312. It should be noted that in some embodiments, the power level is not changed or swept, but instead the antenna pattern is measured with a fixed power transmission (e.g., a transmission from a consumer WLAN radio that is the device under test). In this configuration, the RFID tags 316 would give a measure of incident power as opposed to acting at a specific power.

Thus, the RFID reader 308 operates at a different frequency than the antenna 302 connected to the device under test to power the RFID tags 316 and read the signal strength of the frequency under test using RFID transmission and reception protocols. As should be appreciated, in this embodiment, the RFID tags 316 include a dual-band antenna or dual antennas, one supporting measurements of the frequency under test and another supporting the RFID tag power and data collection and reporting functionality as discussed herein.

As can be seen in the embodiment illustrated in FIG. 3, the transmitter 306 is configured to transmit power signals at a second frequency f2 and the data acquisition device 308 (embodied as an RFID reader) is configured to transmit data acquisition signals (e.g., RFID tag activation and read request signals) at a first frequency f1 and receive responses (e.g., RFID tag read data) at the first frequency.

Figure 4:
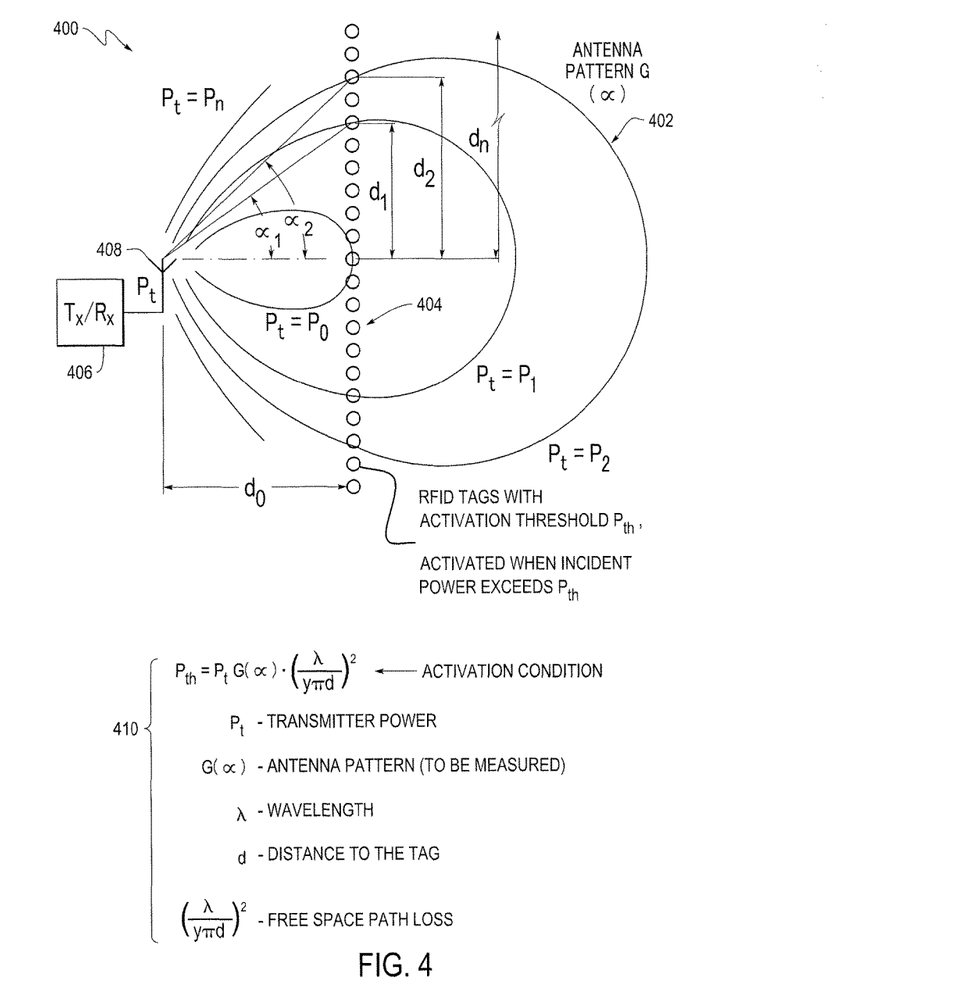
FIG. 4 is a diagram illustrating an antenna calculation method according to one or more embodiments.

FIG. 4 illustrates one method for calculating an antenna pattern based on, for example, the received signals acquired from the activated tags 104, 204, 216 or 316, with different ones of the tags 104, 204, 216 or 316 activated at different power levels as described herein. In FIG. 4, a two-dimensional pattern calculation method 400 is illustrated that may be used in an embodiment for determining the antenna pattern for a one plane cross-section of an antenna pattern 402 using a linear array of wirelessly powered sensors (illustrated as RFID tags 404), which may be arranged as a flat line of RFID tags 404. In an embodiment where the sensors are identical, each sensor has a certain defined activation threshold. However, it should be appreciate that in various embodiments, the sensor do not have to be identical, but may have, for example, different operating characteristics.

By varying the transmit power of the RFID reader 406 connected to an antenna 408 in incremental steps (e.g., small steps, such as 0.1 dB) and recording at each step which sensors are activated (which is determined based on the sensors that respond with an RFID read signal at each of the power levels), an antenna pattern can be calculated as illustrated at 410 and discussed herein, where $P_{th}$ defines the activation condition for the sensors and $(\lambda/4\pi d)^2$ defines the free space loss.

In some embodiments, it is assumed that all sensors are co-polarized with the antenna under test 408 and have omni-directional patterns (dipoles). Accordingly, the antenna pattern based on the received signals from the sensors may be determined as follows: $G(\alpha_n)=(P_{th}/P_n)\cdot((4\pi(d_0+d_n))/\lambda)^2$. Thus, using a low cost and portable system, the antenna pattern for an antenna under test can be calculated. For example, as described herein, an RFID reader may be used as a wireless activating device operating at incremental transmitting power levels that causes RFID tags to be turned on and respond with a read signal. Accordingly, in operation, as the transmission power level increases, more sensors (e.g., RFID tags 404), such as different subsets of sensors, are activated (e.g., more RFID tags 404 at the periphery of the previous transmission range are activated). Based on the known location of the RFID tags in an array and knowing the power level at which each of the RFID tags was activated, an antenna pattern can be calculated as described above (at maximum power, all RFID tags will respond). It should be noted that variable frequency transmissions may also be used as described herein.

Figure 5:
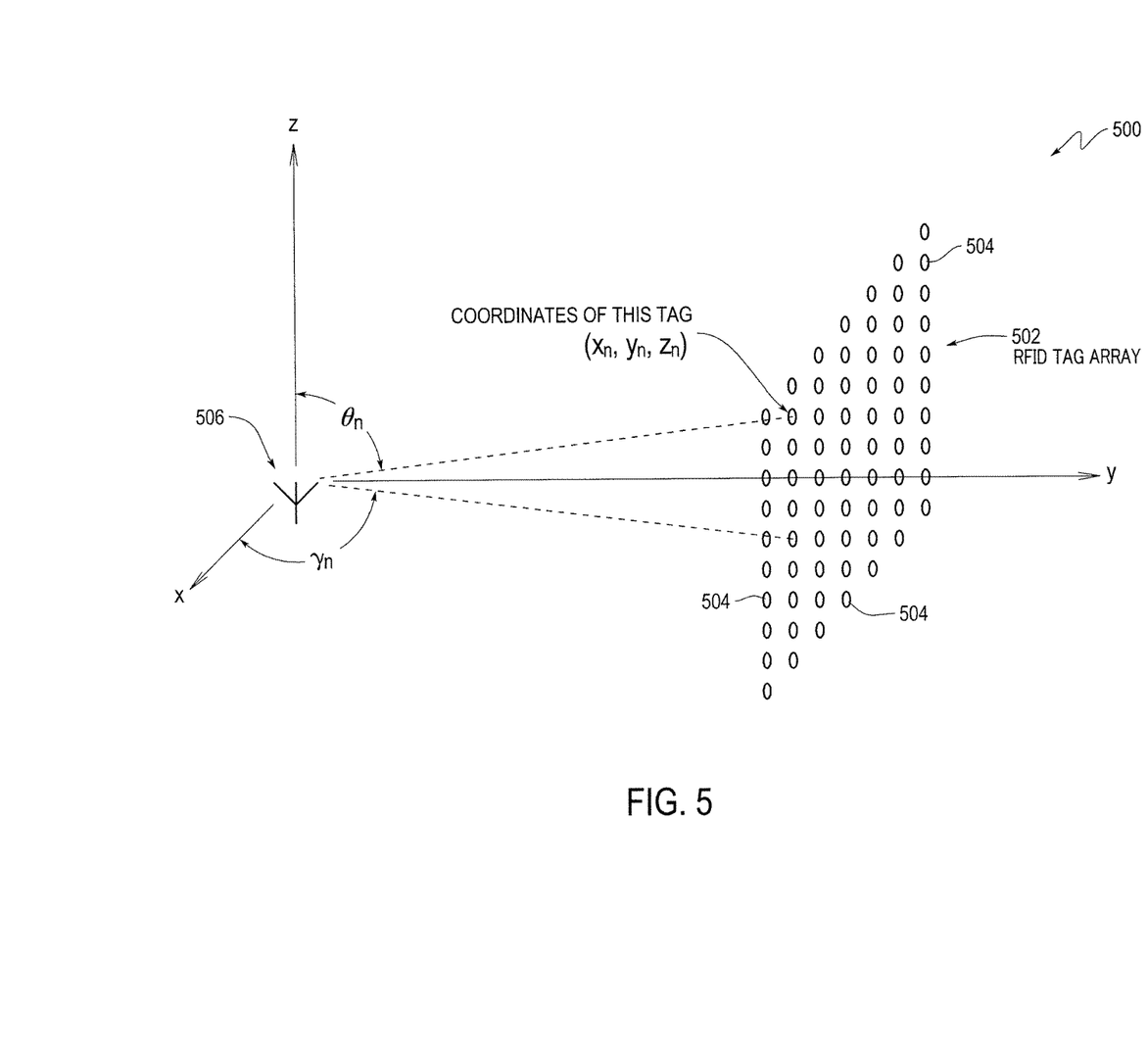
FIG. 5 is a diagram illustrating another antenna calculation method according to one or more embodiments.

The same method illustrated in FIG. 4 can be used and applied to calculate part of a full three-dimensional antenna pattern as illustrated in FIG. 5. In the three-dimensional pattern calculation method 500, a three-dimensional antenna pattern may be calculated based on the received signals acquired, for example, from the activated tags 104, 204, 216 or 316, with different ones of the tags 104, 204, 216 or 316 activated at different power levels as described herein. In FIG. 5, an embodiment for determining the antenna pattern using a two-dimensional array 502 of wirelessly powered sensors (illustrated as RFID tags 504) is illustrated. In an embodiment where the sensors are identical, each sensor has a certain defined activation threshold as described herein. It also should be noted that the two-dimensional array 502 of wirelessly powered sensors may be coupled to, for example, a flexible base, such as to form a roll of passive sensors that may be rolled out into a two-dimensional sheet (e.g., planar array of sensor tags on a flexible sheet material).

Similar to the method illustrated in FIG. 4, by varying the transmit power of, for example, the RFID reader 406 (illustrated in FIG. 4) connected to an antenna 506, in incremental steps (e.g., small steps of 0.1 dB) and recording at each step which sensors are activated (which is determined based on the sensors that respond with an RFID read signal at each of the power levels), an antenna pattern can be calculated as follows: $G(\theta n, \rho_n) = (P_{th}/P_n) \cdot ((4\pi(x_n+y_n+z_n))/\lambda)^2$, where $\rho_n = (y_n/x_n)$ and $\tan \theta_n = (y_n/z_n)$. $P_n$ is the minimum transmit power to activate an RFID tag 504 with coordinates $(x_n+y_n+z_n)$. Thus, knowing $P_n$ allows for the calculation of the antenna gain in the direction $(\theta n, \rho_n)$ as discussed above. Accordingly, different three-dimensional antenna patterns having different pattern shapes may be calculated using one or more embodiments.

It should be appreciated that the sensors in various embodiments may be different types of sensors, such as passive RFID tags, including, for example, 2.4 GHz RFID tags available from Intermec Technologies Corporation, which can be used for radiation antenna pattern measurements of 2.4 GHz antennas (e.g., Bluetooth or WiFi antennas). As another example, the sensors may be 900 MHz RFID tags that can be used for radiation antenna pattern measurements of 900 MHz antennas (e.g., GSM and UMTS antennas). Thus, different types of sensors that are capable of wireless communication and being powered wirelessly may be used to measure antenna patterns as described herein.

In various embodiments and as described herein, by knowing the power at which the RFID tag is activated and the physical location of the RFID tag (such as within the array), the antenna pattern for an antenna under test may be determined. It should be appreciated that other operating characteristic optionally may be used. For example, the phase of the RFID tags also may be used to determine the antenna pattern, such as to reconstruct an antenna pattern using Euclidean geometry (based on the activation of RFID tags at known locations that are activated at different power levels). In this embodiment, using the phase information for the RFID tags, the distance of the tag from the antenna under test is also known and may be used to perform an automatic configure operation (e.g., determining a transmission range and power range).

Thus, because each of the RFID tags has a unique ID corresponding to the RFID IC 312 in the individual RFID tags, various embodiments are able to determine which specific RFID tags are activated at each of the power levels. The determination of the IDs associated with each of the RFID ICs 114, and thus, with each of the RFID tags (sensors), may be stored in a lookup table or other memory to allow for lookup of the IDs for each of the RFID ICs 114.

Figure 6:
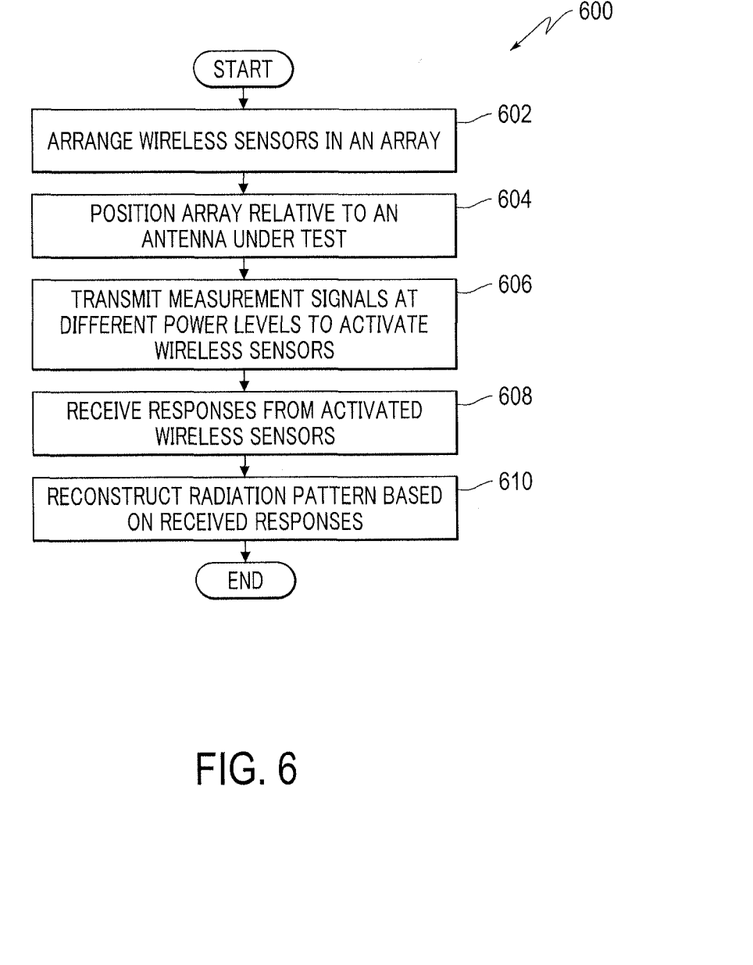
FIG. 6 is a flowchart of a method according to one or more embodiments.

A method 600 for calculating an antenna pattern is illustrated in FIG. 6. It should be appreciated that the method 600 may be implemented by one or more of the embodiments disclosed herein, which may be combined or modified as desired or needed. Thus, the method 600 may be implemented or performed using one or more systems described herein, such as with the different sensor arrays. Additionally, the steps in the method 600 may be modified, changed in order, performed differently, performed sequentially, concurrently or simultaneously, or otherwise modified as desired or needed. The steps also may be performed by a controller, such as the base station unit 108 (illustrated in FIG. 1), such that the controller is a specialized processing machine/specialized hardware.

The method 600 includes arranging wireless sensors in an array at 602. For example, plural RFID tags may be arranged in a pattern (e.g., rectangular pattern) on a base material or substrate (e.g., a plastic composite material that may be rolled and unrolled). Each of the RFID tags has an associated unique ID that allows for subsequent determination of the RFID tag that responds to an activation signal (e.g., RFID read signal). For example, the location of each of the RFID tags in the array and the corresponding ID for the RFID tags may be stored in a memory, such as within a database 114 (shown in FIG. 1), such that the location of the responding RFID tags in the array at different power levels may be determined.

In various embodiments, the wireless sensors are configured as antennas (such as dipoles, cross-dipoles or wideband antennas) that include a smart circuit that harvests RF power, wakes up or is activated at a certain power level and can backscatter data to the base station that is connected to an antenna under test. For example, a passive RFID tag that does not contain a battery, but is supplied power by the wireless transmitter, such as an RFID reader, includes an RFID IC that operates as a smart circuit that allows for harvesting RF power and then responding with RFID data, such as the unique ID for that RFID tag. Thus, in operation, the radio waves (RFID read signals) from the RFID reader are received by a passive RFID tag, the coiled antenna within the RFID tag forms a magnetic field and the RFID tag draws power therefrom, which is used to energize the circuits in the RFID tag.

The wireless sensors may be arranged on any type and shape of surface. For example, plural RFID tags may be placed on a flat or spherical or other shaped surface and the array of RFID tags positioned relative to an antenna under test at 604. For example, the array of RFID tags may be positioned at a certain distance from the antenna under test, such as at an RFID read operating range of the RFID tags. As should be appreciated, in this array pattern, different ones of the RFID tags that are positioned at different distances or angles from the RFID reader and are activated at different power levels.

The method 600 further includes transmitting measurement signals at different power levels to activate the wireless sensors at 606. For example, an RFID reader or similar type of transmitting and receiving device transmits RFID read signals at a first power level, receives responses from activated RFID tags (e.g., backscatter responses) at 608, stores the responses and then performs the same process at incrementally different (e.g., incrementally higher) power levels until all of the RFID tags have responded. In various embodiments, the number of RFID tags in the array is known and when all of the RFID tags have responded, the method determines that the complete array has been activated. It should be noted that the power level increments may be varied as desired or needed, such as based on the passive activation power level of the RFID tags.

In various embodiments, the unique ID of the responding RFID tags at each power level are stored with the corresponding power level at which the RFID tag responded. Thus, a determination can be made as to which RFID tags (having known locations) responded to the RFID signals at the different power levels. For example, at different power transmission levels of the transmitter, such as the RFID reader, one or more of the RFID tags in the array are activated. As the transmission power increases, more of the RFID tags are activated, until at a certain transmission power level, all of the RFID tags will have responded.

The method 600 includes reconstructing a radiation pattern based on the received responses at 610. For example, based on the location of the RFID tags responding at each of the transmission power levels, an antenna radiation pattern of the antenna under test can be calculated as described herein. For example, the antenna pattern can be calculated as a function of the array geometry and power levels. It should be noted that the antenna under test may be connected to the device activating the wireless sensors or may be connected to a separate wireless transmitter as described herein.

It should be noted that one or more embodiments can comprise one or more microprocessors (which may be embodied as a processor) and a memory, coupled via a system bus. The microprocessor can be provided by a general purpose microprocessor or by a specialized microprocessor (e.g., an ASIC). In one embodiment, the system can comprise a single microprocessor which can be referred to as a central processing unit (CPU). In another embodiment, the system 100 can comprise two or more microprocessors, for example, a CPU providing some or most of the scanning functionality and a specialized microprocessor performing some specific functionality, such as to determine distance information and correlate that information with the acquired image information. A skilled artisan would appreciate the fact that other schemes of processing tasks distribution among two or more microprocessors are within the scope of this disclosure. The memory can comprise one or more types of memory, including but not limited to: random-access-memory (RAM), non-volatile RAM (NVRAM), etc.

It should be noted that, for example, the various embodiments can communicate between components using different standards and protocols. For example, the wireless communication can be configured to support, for example, but not limited to, the following protocols: at least one protocol of the IEEE 802.11/802.15/802.16 protocol family, at least one protocol of the HSPA/GSM/GPRS/EDGE protocol family, TDMA protocol, UMTS protocol, LTE protocol, and/or at least one protocol of the CDMA/1xEV-DO protocol family.

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The corresponding structures, materials, acts, and equivalents of any means or step plus function elements in the claims below are intended to include any structure, material, or act for performing the function in combination with other claimed elements as specifically claimed. The description of the present disclosure has been presented for purposes of illustration and description, but is not intended to be exhaustive or limited to embodiments in the form disclosed. Many modifications and variations will be apparent to those of ordinary skill in the art without departing from the scope and spirit of embodiments of the disclosure. The embodiments were chosen and described in order to best explain the principles of embodiments and practical application, and to enable others of ordinary skill in the art to understand embodiments with various modifications as are suited to the particular use contemplated.

Furthermore, as will be appreciated by one skilled in the art, aspects of the present disclosure may be embodied as a system, method, or computer program product. Accordingly, aspects of various embodiments may take the form of an entirely hardware embodiment, an entirely software embodiment (including firmware, resident software, micro-code, etc.) or an embodiment combining software and hardware aspects that may all generally be referred to herein as a "circuit," "module", "system" or "sub-system." In addition, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM) or similar DVD-ROM and BD-ROM, an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for one or more embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

At least some of the present disclosure is described herein with reference to flowchart illustrations and/or block diagrams of methods, apparatus (systems) and computer program products according to embodiments described herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks and when implemented in one or more embodiments, results in a transforming or converting a general purpose computer/processor/hardware to a specialized computer/processor/hardware that improves the technological art.

The foregoing descriptions of specific embodiments have been presented for purposes of illustration and description. They are not intended to be exhaustive or to limit the embodiments to the precise forms disclosed, and obviously many modifications and variations are possible in light of the above teaching. The embodiments were chosen and described in order to best explain principles and practical applications thereof, and to thereby enable others skilled in the art to best utilize the various embodiments with various modifications as are suited to the particular use contemplated. It is understood that various omissions and substitutions of equivalents are contemplated as circumstances may suggest or render expedient, but these are intended to cover the application or implementation without departing from the spirit or scope of the claims. The following claims are in no way intended to limit the scope of embodiments to the specific embodiments described herein.

B1. In one embodiment, a system may include
a plurality of wireless sensors arranged in an array, the wireless sensors configured to be powered by radio-frequency (RF) signals;
a controller configured to wirelessly transmit the RF signals with a fixed power transmission and measure responses from the wireless sensors to obtain a measure of incident power from the plurality of wireless sensors; and
a processor configured to calculate a radiation pattern of an antenna under test using the measured responses.

What is claimed is:

1. A system comprising:
a wireless transmitter configured to transmit radio-frequency (RF) signals to an array of radio-frequency identification (RFID) tags that includes (1) a first RFID tag that is configured to only be activated when receiving a first RF signal at a power level above a first threshold and (2) a second RFID tag that is configured to be only activated when receiving a second RF signal at a power level above a second threshold different from the first threshold, each RFID tag of the array of RFID tags includes in memory an identifier unique to the RFID tag;
a wireless receiver configured to receive signals from RFID tags activated in response to receiving the first or section RF signals, the signals from the RFID tags including the identifier of the respective RFID tag; and
a processor configured to calculate a radiation pattern of the wireless transmitter by calculating for each respective RFID tag a determined power level for each respective activated RFID tag and plotting the determined power level at a location associated with the respective RFID tag.

2. The system of claim 1, further comprising a radio frequency identification (RFID) reader that includes the transmitter and receiver.

3. The system of claim 2, wherein the RFID reader is configured to transmit RF signals that power the plurality of RFID tags and cause the RFID tags to backscatter signals when activated.

4. The system of claim 1, wherein the wireless transmitter is configured to transmit signals using a wireless protocol, and further comprising a radio frequency identification (RFID) reader that includes an RFID transmitter and the receiver, the RFID tags activated by signals transmitted from the RFID transmitter using an RFID communication protocol different than the wireless protocol.

5. The system of claim 4, wherein the RFID reader is configured to transmit and receive at a first frequency and the wireless transmitter is configured to transmit at a second frequency different than the first frequency.

6. The system of claim 1, further comprising a signal generator configured to generate the RF signals at incrementally higher transmission power levels to activate different subsets of the RFID tags.

7. The system of claim 1, further comprising a base material on which the RFID tags are arranged in the array, the base material being flexible and configured to be in a rolled state or an unrolled state with the RFID tags arranged thereon.

8. The system of claim 1, wherein the wireless transmitter and wireless receiver are configured to operate in a near-field with respect to the plurality of RFID tags.

9. The system of claim 1, wherein the wireless transmitter and wireless receiver are configured to operate in a far-field with respect to the plurality of RFID tags.

10. The system of claim 1, wherein the processor is configured to use Euclidean geometry to reconstruct the radiation pattern.

11. The system of claim 1, wherein the plurality of RFID tags include visual indicators to provide visualization of an RF field pattern produced by the RF signals transmitted by an antenna under test.

12. A system comprising:
    a plurality of wireless sensors arranged in an array, the wireless sensors configured to be powered by radio-frequency (RF) signals at different power levels;
    a controller configured to transmit the RF signals at different power levels and measure responses from the wireless sensors at the different power levels; and
    a processor configured to calculate a radiation pattern of an antenna under test using the measured responses and a geometry of the array including locations associated to respective wireless sensors in the array.

13. The system of claim 12, wherein the plurality of wireless sensors are radio frequency identification (RFID) tags operable as individually addressable power sensors that turn on at a predefined power level.

14. The system of claim 13, wherein the controller is an RFID reader coupled to the antenna under test.

15. The system of claim 13, wherein the controller is an RFID reader not coupled to the antenna under test.

16. The system of claim 12, wherein the controller is configured to sweep the RF signals at different power levels and frequencies.

17. The system of claim 16, wherein the processor is configured to calculate the radiation pattern of the antenna under test as a function of the geometry of the array and the RF signals swept at the different power levels.

18. A method for calculating an antenna pattern, the method comprising:
    transmitting RF signals at different power levels to a plurality of wireless sensors arranged in an array to power the plurality of wireless sensors and cause the wireless sensors to transmit response signals;
    receiving the response signals from the wireless sensors at the different power levels; and
    calculating a radiation pattern of an antenna under test using the received response signals and a geometry of the array including locations associated to respective wireless sensors in the array.

19. The method of claim 18, wherein the plurality of wireless sensors are radiofrequency identification (RFID) tags and further comprising sweeping RFID read signals at the different power levels.

20. The method of claim 19, wherein sweeping the RFID read signals comprises using an RFID reader to power the RFID tags, sweep the RFID read signals and receive the response signals.

* * * * *